(12) United States Patent
Li et al.

(10) Patent No.: US 11,444,025 B2
(45) Date of Patent: Sep. 13, 2022

(54) TRANSISTOR AND FABRICATION METHOD THEREOF

(71) Applicant: Taiwan Semiconductor Manufacturing Company, Ltd., Hsinchu (TW)

(72) Inventors: Hung-Wei Li, Hsinchu (TW); Yu-Ming Lin, Hsinchu (TW); Mauricio Manfrini, Hsinchu County (TW); Sai-Hooi Yeong, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 17/156,648

(22) Filed: Jan. 25, 2021

(65) Prior Publication Data

US 2021/0398899 A1    Dec. 23, 2021

Related U.S. Application Data

(60) Provisional application No. 63/041,098, filed on Jun. 18, 2020.

(51) Int. Cl.
| | |
|---|---|
| *H01L 23/52* | (2006.01) |
| *H01L 29/78* | (2006.01) |
| *H01L 23/522* | (2006.01) |
| *H01L 23/532* | (2006.01) |
| *H01L 27/11587* | (2017.01) |
| *H01L 27/1159* | (2017.01) |
| *H01L 29/66* | (2006.01) |

(52) U.S. Cl.
CPC ...... *H01L 23/5226* (2013.01); *H01L 23/5329* (2013.01); *H01L 23/53223* (2013.01); *H01L 27/1159* (2013.01); *H01L 27/11587* (2013.01); *H01L 29/6684* (2013.01); *H01L 29/78391* (2014.09)

(58) Field of Classification Search
CPC ........... H01L 23/5226; H01L 23/53223; H01L 23/5329; H01L 27/11587; H01L 27/1159; H01L 29/6684; H01L 29/78391; H01L 29/516; H01L 29/66969
USPC ........................................................ 257/774
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Sheikh Maruf
(74) *Attorney, Agent, or Firm* — JCIPRNET

(57) ABSTRACT

A transistor includes a gate, a channel layer, a gate insulation layer, a passivation layer, a liner, a first signal line, and a second signal line. The first signal line is embedded in the passivation layer to form a first via in the passivation layer and overlapping the channel layer. The second signal line is embedded in the passivation layer to form a second via in the passivation layer overlapping the channel layer. The second signal line is in contact with the channel layer. The liner includes an insulation region and a conductive region connected with the insulation region. The insulation region is disposed over the passivation layer and on sidewalls of the first via. The conductive region is disposed under a bottom of the first via and connected with the channel layer. The first signal line is electrically connected with the channel layer through the conductive region.

13 Claims, 11 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1* | 12/2016 | Chang .............. H01L 21/823864 |
| 9,576,814 B2 | 2/2017 | Wu et al. |
| 2013/0270620 A1* | 10/2013 | Hu .................. H01L 21/823481 |
| | | 257/296 |
| 2014/0084340 A1* | 3/2014 | Wang ................ H01L 29/7848 |
| | | 257/190 |
| 2014/0264641 A1* | 9/2014 | Frohberg ............ H01L 29/4175 |
| | | 438/667 |
| 2014/0339539 A1* | 11/2014 | Yamazaki ........... H01L 27/1255 |
| | | 257/43 |
| 2014/0340608 A1* | 11/2014 | Yamazaki ......... H01L 29/78648 |
| | | 349/47 |
| 2015/0028332 A1* | 1/2015 | Oda .................. H01L 29/41733 |
| | | 257/43 |
| 2015/0048365 A1* | 2/2015 | Tsubuku ........... H01L 29/78606 |
| | | 257/43 |
| 2015/0077162 A1* | 3/2015 | Yamazaki .............. G11C 19/28 |
| | | 327/212 |
| 2015/0200158 A1* | 7/2015 | Okumura ................ H01L 24/13 |
| | | 438/612 |
| 2015/0200212 A1* | 7/2015 | Xun .................. H01L 29/78618 |
| | | 257/43 |
| 2016/0005617 A1* | 1/2016 | Wu ....................... H01L 21/308 |
| | | 438/702 |
| 2017/0033048 A1* | 2/2017 | Kim .................. H01L 29/66795 |

\* cited by examiner

TRANSISTOR AND FABRICATION METHOD THEREOF

CROSS-REFERENCE TO RELATED APPLICATION

This application claims the priority benefit of U.S. provisional application Ser. No. 63/041,098, filed on Jun. 18, 2020. The entirety of the above-mentioned patent application is hereby incorporated by reference herein and made a part of this specification.

BACKGROUND

Memory cell is widely used to store information (both data and program) in a digital system. Modern day a memory cell comprises millions or billions of signal lines and transistor devices. Memory circuit may use many different types of transistor devices, depending on an application of the memory cell. As a non-volatile memory cell, a ferroelectric random access memory (FERAM) offers high density, low power consumption, high speed, and low manufacturing cost. One advantage of the FERAM compared to a static random access memory (SRAM) and/or a dynamic random access memory (DRAM) is its significantly smaller size (about one-third to about one-fourth the size of an SRAM cell).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
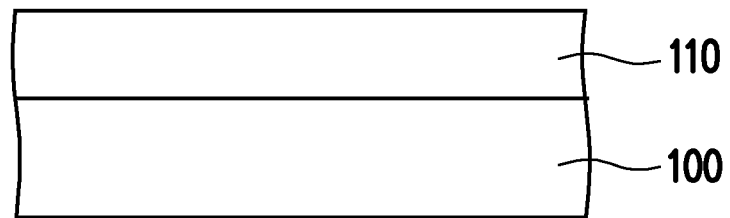
FIGS. 1A through 1I schematically illustrate cross-sectional views for a fabrication method of a transistor in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 1H schematically illustrate cross-sectional views for a fabrication method of a transistor in accordance with some embodiments of the disclosure. FIG. 2 schematically illustrates a top view of transistor in FIG. 1H. FIGS. 1A through 1H are the cross-sectional views corresponding to line AA in FIG. 2.

Figure 2:
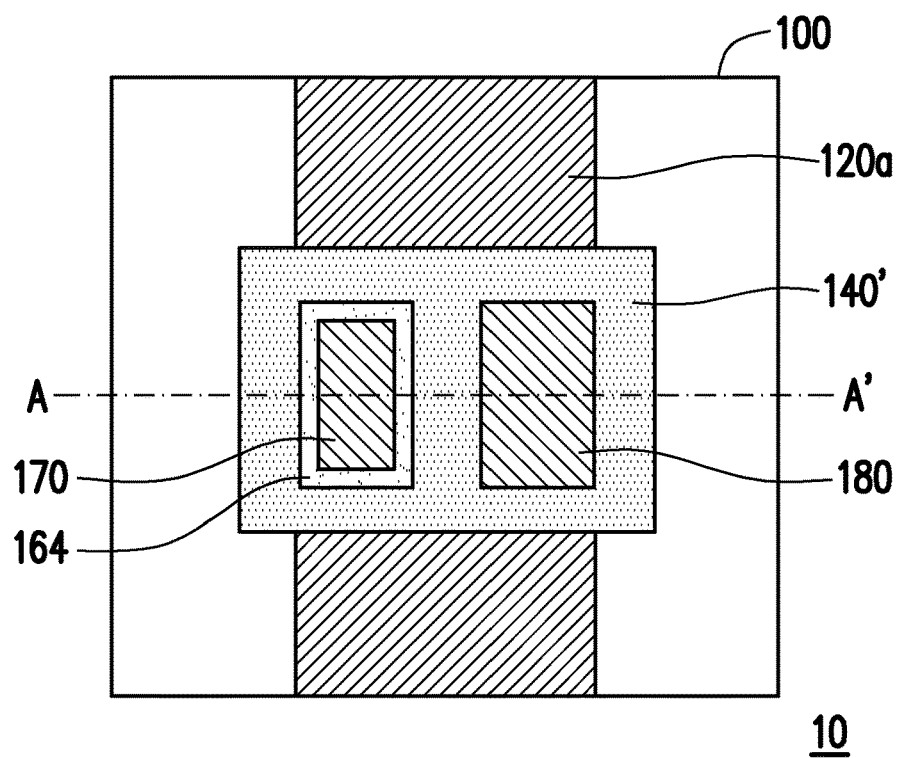
FIG. 2 schematically illustrates a top view of transistor in FIG. 1H.

As shown in FIG. 1A, a dielectric layer 110 is formed over a substrate 100. In some embodiments, a material of the dielectric layer 110 includes silicon based insulating material, such as silicon oxide, silicon nitride, SiOC, SiCN, SiOCN, SiON, $Al_2O_3$, $HfO_2$, $La_2O_3$ or $ZrO_2$ formed by thermal oxidation, thermal nitridation, chemical vapor deposition (CVD), atomic layer deposition (ALD) or physical vapor deposition (PVD). The dielectric layer 110 has a single-layer structure or a multi-layer structure. The substrate 100 is, for example, a glass substrate, a semiconductor substrate (such as Si substrate, SiGe substrate, SiC substrate, or a group III-V semiconductor substrate), or another suitable substrate. In some embodiments, the substrate 100 may be an insulator film such as $Al_2O_3$ or $SiO_2$ formed by thermal oxidation, ALD or other suitable process.

Figure 1B:
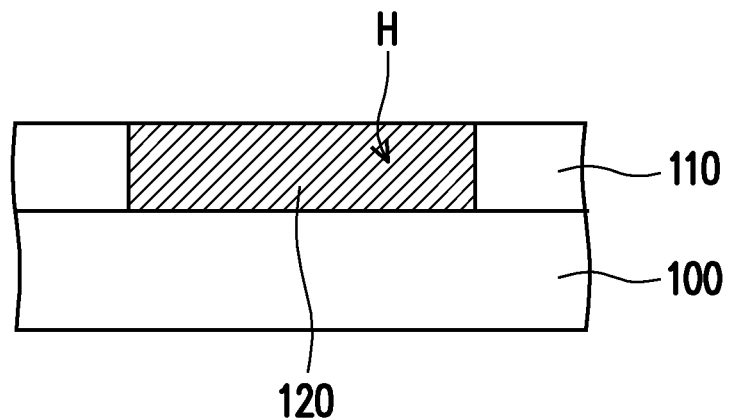

As shown in FIG. 1B, a through hole H is formed in the dielectric layer 110. A method of forming the through hole H includes photolithography process, etching process, or other suitable process, or the combination thereof. In some embodiments, other insulation layer is formed on the substrate 100 before forming the dielectric layer 110, and the insulation layer may be disposed between the bottom substrate 100 and the dielectric layer 110. That is, the insulation layer mentioned above may be exposed by the through hole H, and the substrate 100 under the through hole H may be covered by the insulation layer.

A gate 120 is formed over a substrate 100 and disposed in the through hole H. That is, the gate 120 is embedded in the dielectric layer 110. The gate 120 may has a single-layer structure or a multi-layer structure. In some embodiments, one or more conductive materials are deposited on the top surface of dielectric layer 120 and filling in the through hole H. Then, a planarization operation, such as chemical mechanical polishing (CMP) or an etch-back process, is performed so as to remove an upper part of the conductive materials, thereby forming the gate 120. In some embodiments, the gate 120 includes Mo, W, Ru, Pt, TiN, TaN, TaAlC, TiC, TaC, Co, Al, TiAl, HfTi, TiSi, TaSi or TiAlC, or a multi-layer of two or more of these materials, or other high work function metal material. In some embodiments, the gate 120 is electrically connected with a word line 120a (shown in FIG. 2).

In this embodiment, the dielectric layer 110 having the through hole H is formed before forming the gate 120.

However, the disclosure is not limited thereto. In other embodiments, the gate 120 is formed before forming the dielectric layer 110. After forming the gate 120, the dielectric layer 110 is formed to cover the top surface and the sidewalls of the gate 120. Then, a planarization operation, such as chemical mechanical polishing (CMP) or an etch-back process, is performed to remove a portion of the dielectric layer 110 (and the gate 120) to expose the top surface of the gate 120. In some embodiments, a thickness of the dielectric layer 110 is the same as a thickness of the gate 120.

Figure 1C:
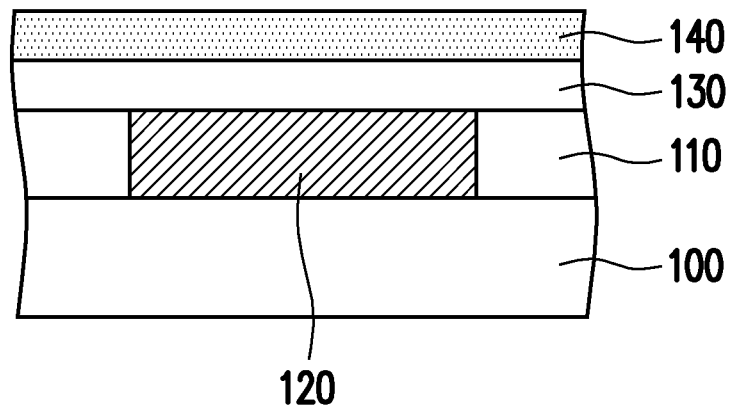

As shown in FIG. 1C, a gate insulation layer 130 is formed over the dielectric layer 110 and the gate 120. In some embodiments, the gate insulation layer 130 is a multi-layer structure including an insulating layer and a ferroelectric (FE) material layer. The insulating layer of the gate insulation layer 130 is made of one or more layers of insulating material, such as silicon oxide, silicon nitride, silicon oxynitride, high k dielectric (such as $HfO_2$ or $Al_2O_3$), organic material, or other dielectric materials, or the combination thereof. the FE material includes one or more of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, and $Ta_2O_5$. In some embodiment, the gate insulation layer 130 is a single-layer structure including one of the insulating layer and the ferroelectric (FE) material layer.

A ferroelectric material has a nonlinear relationship between the applied electric field and the stored charge. Specifically, the ferroelectric characteristic has the form of a hysteresis loop, which is very similar in shape to the hysteresis loop of ferromagnetic materials. Semi-permanent electric dipoles are formed in the crystal structure of the ferroelectric material. When an external electric field is applied across a dielectric, the dipoles tend to align themselves with the field direction, produced by small shifts in the positions of atoms and shifts in the distributions of electronic charge in the crystal structure. After the charge is removed, the dipoles retain their polarization state. In a 1T-type FERAM, the remaining polarization state affects a threshold voltage Vt of an FET, and when a voltage is applied, a current value changes depending on the remaining polarization state, thereby storing/reading binary "0" and "1" data.

In some embodiments, an intermediate conductive layer is disposed on the gate 120 before forming the gate insulation layer 130. The intermediate conductive layer is one or more layers of conductive material, such as TiN, Ti, TaN and/or W.

A metal oxide layer 140 is formed over the gate insulation layer 130. The metal oxide layer 140 includes metal oxide, such as indium gallium zinc oxide (IGZO) or other suitable oxides. A method of forming the metal oxide layer 140 includes CVD or other suitable process.

Figure 1D:
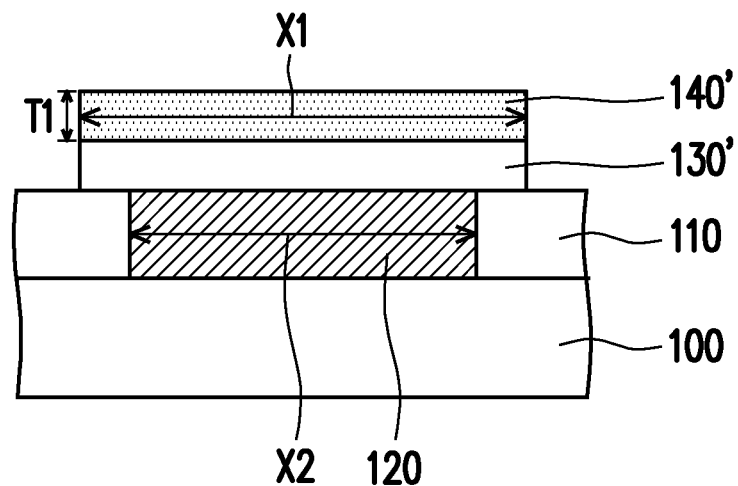

As shown in FIG. 1D, the metal oxide layer 140 is patterned by lithography and etching operations so as to form the channel layer 140'. In some embodiments, the gate insulation layer 130 is also patterned so as to form a gate insulation layer 130' when patterning the metal oxide layer 140, wherein the sidewalls of the gate insulation layer 130' are aligned with the sidewalls of the channel layer 140'. In some embodiments, the gate insulation layer 130 is not patterned after patterning the metal oxide layer 140. Therefore, the sidewalls of the gate insulation layer 130' are not aligned with the sidewalls of the channel layer 140'.

In some embodiment, a width X1 of the channel layer 140' is larger than the width X2 of the gate 120. In other word, a vertical projection of the channel layer 140' on the substrate 100 is wider than a vertical projection of the gate 120 on the substrate 100. The sidewalls of the vertical projection of the gate 120 on the substrate 100 is located between the sidewalls of a vertical projection of the channel layer 140' on the substrate 100. A thickness T1 of the channel layer 140' is in a range between 0.5 nm to 50 nm.

Figure 1E:
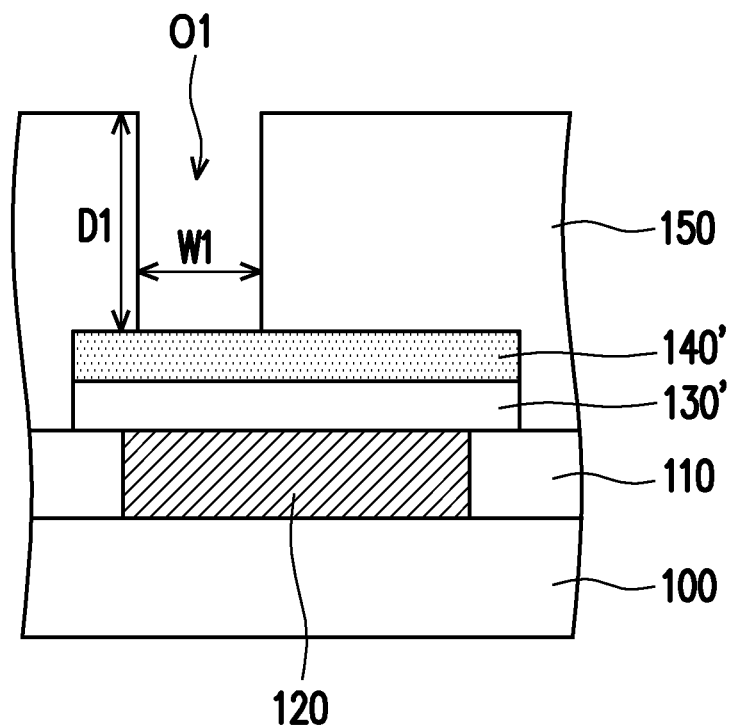

A first passivation layer 150 is formed over the gate insulation layer 130', as shown in FIG. 1E. In this embodiment, the first passivation layer 150 is formed on the channel layer 140' and the dielectric layer 110. The first passivation layer 150 has a first opening O1 overlapped with the channel layer 140'. In some embodiments, the first opening O1 is formed by processes including a photolithography process and an etching process. The depth D1 of the first opening O1 is in a range from about 5 nm to about 500 nm. The width W1 of the first opening O1 is in a range from about 20 nm to about 200 nm. The first passivation layer 150 includes silicon based insulating material, such as silicon oxide, Silicon nitride, SiOC, SiCN, SiOCN or SiON formed by thermal oxidation, thermal nitridation, CVD or atomic layer deposition (ALD). In some embodiment, the first passivation layer 150 is deposited under a hydrogen environment, and the first passivation layer 150 contains hydrogen. For example, in some chemical vapor deposition processes, silane ($SiH_4$) is react with oxygen ($O_2$) to generate silicon oxide ($SiO_2$) and hydrogen ($H_2$). In some embodiments, additional hydrogen gas is applied when depositing the first passivation layer 150.

Figure 1F:
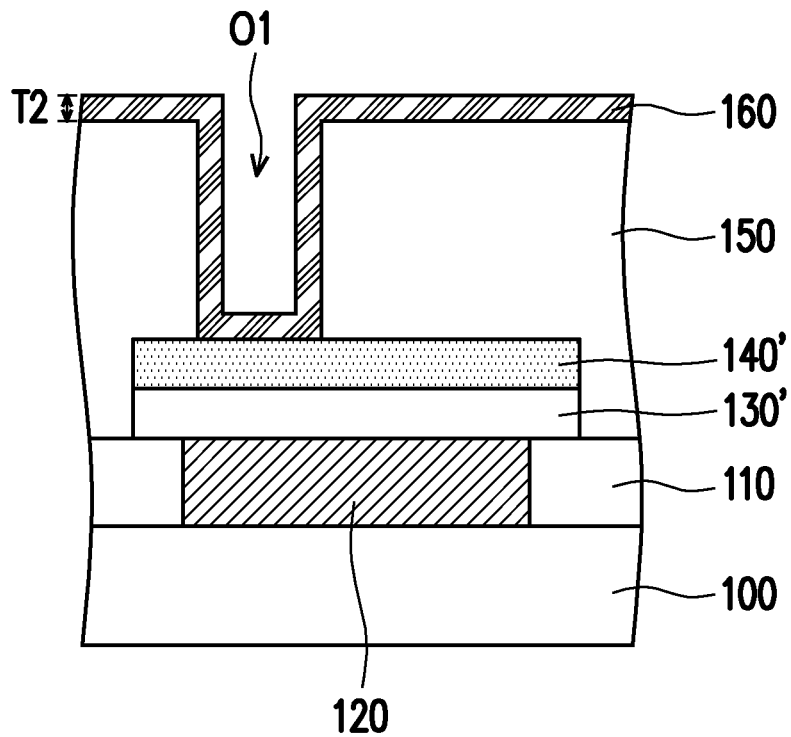

Referring to FIG. 1F, a metal layer 160 is formed on the first passivation layer 150 and in the first opening O1 by CVD, ALD, chemical plating, electric less plating and/or physical vapor deposition (PVD) including sputtering. The metal layer 160 covers a surface of the channel layer 140' exposed by the first opening O1 and the metal layer 160 is directly in contact with the channel layer 140'. The metal layer 160 covers sidewalls of the first opening O1 and a top surface of the first passivation layer 150.

The thickness T2 of the metal layer 160 is in a range from about 1 nm to about 20 nm. In some embodiments, the metal layer 160 includes aluminum (Al).

Figure 1G:
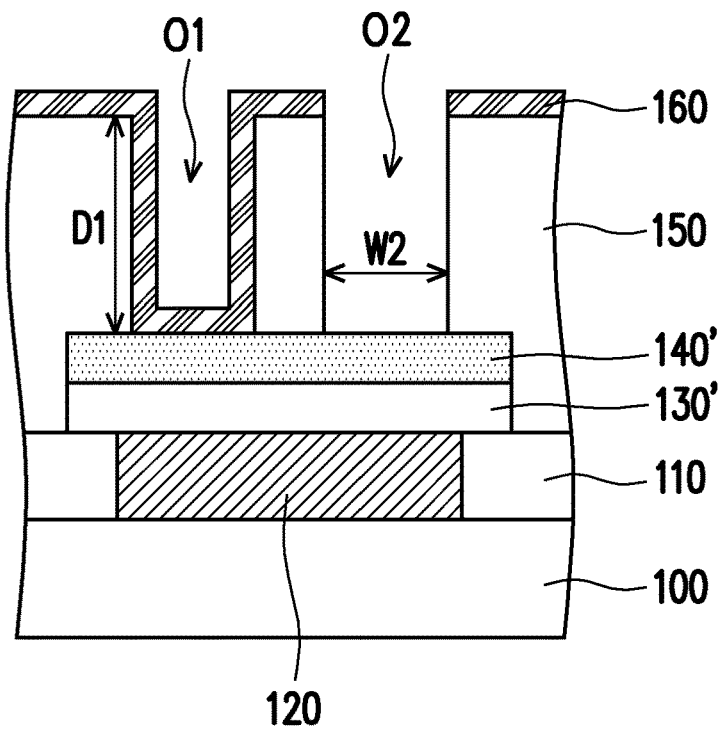

As shown in FIG. 1G, a second opening O2 penetrating through the passivation layer 150 and the metal layer 160 is formed by lithography and etching operations. The second opening O2 is overlapped with the channel layer 140', and the surface of the channel layer 140' is exposed by the second opening O2. In some embodiments, the depth D1 of the first opening O1 is about equal to or less than the depth of the second opening O2. In some embodiments, the width W2 of the second opening O2 is in a range from about 20 nm to about 200 nm.

Figure 1H:
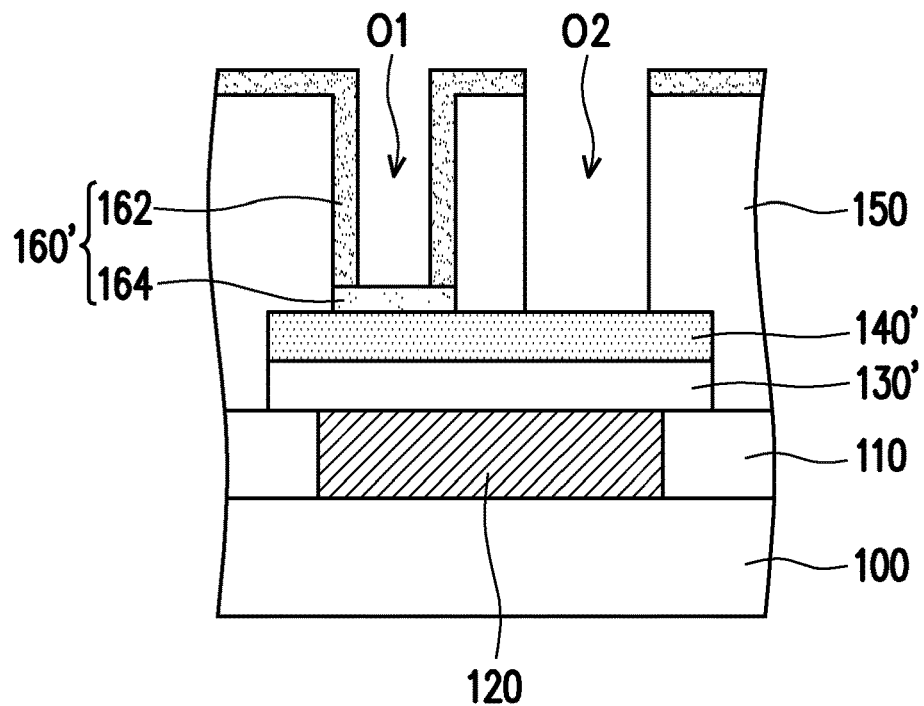

As shown in FIG. 1H, a thermal annealing process is performed to heat the metal layer 160. Then, a liner 160' is formed. The liner 160' includes an insulation region 162 and a conductive region 164 connected with the insulation region 162. In some embodiments, the thermal annealing process is performed in an oxygen environment at 200° C. to 400° C.

In some embodiment, hydrogen in the first passivation layer 150 may incorporated into the channel layer 140' after deposition of the first passivation layer 150. Then, the hydrogen in the channel layer 140' is released through the second opening O2 during the thermal annealing process.

That is, a portion of the channel layer 140' exposed by the second opening O2 become intrinsic metal oxide (such as IGZO) after the thermal annealing process.

The insulation region 162 is disposed over the first passivation layer 150 and the sidewalls of the first opening O1. In some embodiments, the insulation region 162 includes $Al_2O_3$. The insulation region 162 of the liner 160' is configured to protect the first passivation layer 150.

The conductive region 164 is disposed in a bottom of the first opening O1 and directly connected with the channel layer 140'. The element in the metal layer 160, such as aluminum, may react with the channel layer 140', such as indium gallium zinc oxide, so as to form an n-type doped region at the junction between the channel layer 140' and the conductive region 164. In some embodiments, the dissociation energy of In—O, Ga—O and Zn—O are about 346 kJ/mol, 374 kJ/mol, and 250 kJ/mol respectively and the dissociation energy of Al—O is about 502 kJ/mol. That is, In—O and Zn—O are easier to dissociate. In other word, indium atoms and zinc atoms in the channel layer 140' may diffuse toward the metal layer 160 during the thermal annealing process. That is, the conductive region 164 includes AlOx, InOy, and ZnOz, wherein x is not 3/2, and x, y, and z are greater than 0. The AlOx is not a perfect $Al_2O_3$ insulator material.

In this embodiment, the thermal annealing process is performed on the metal layer 160 after forming the second opening O2. However, the disclosure is not limited thereto. In other embodiments, the liner 160' is formed before forming the second opening O2. In some embodiments, the thermal annealing process is performed to the metal layer 160 during depositing the metal layer 160. In some embodiments, the thermal annealing process is performed before forming the second opening O2 and after depositing the metal layer 160.

Figure 1I:
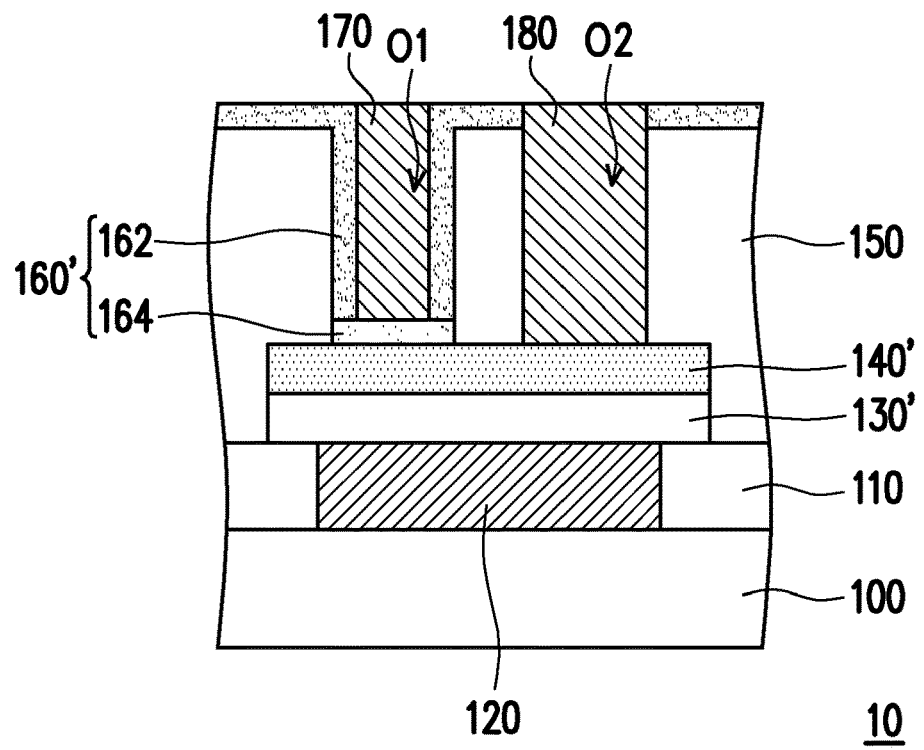

Referring to FIG. 1I and FIG. 2, a first signal line 170 is formed in the first opening O1 to form a first via in the first passivation layer 150 and a second signal line 180 is formed in the second opening O2 to form a second via in the first passivation layer 150. The first via and the second via are overlapping the channel layer 140. In this embodiment, the first signal line 170 and the second signal line 180 are formed in a same process. For example, a metal material is deposited in the first opening O1, in the second opening O2, and on the top surface of the insulation region 162. Then, a planarization operation, such as chemical mechanical polishing (CMP) or an etch-back process, is performed so as to remove an upper part of the metal material, thereby forming the first signal line 170 and the second signal line 180. In some embodiments, the first signal line 170 is made of a material that is the same as a material of the second signal line 180. In some embodiments, the first signal line 170 and the second signal line 180 are high work function metals, such as Ni, Pt, Au, Ru, Pd, Au, Ir, Rh, W or a combination thereof.

The first signal line 170 is disposed in the first opening O1 and electrically connected with the channel layer 140' through the conductive region 164. Ohmic contact is between the first signal line 170 and the channel layer 140'. The first signal line 170 is selectively overlapped with the gate 120.

The second signal line 180 is disposed in the second opening O2 and directly connected with the channel layer 140'. Schottky contact is between the second signal line 180 and the channel layer 140'. By acting as a Schottky contact, the second signal line 180 partially depletes the channel region along the heterojunction and thus, reduces the saturation current of the transistor 10. As a result, the reliability of the transistor 10 is increased when operating at high voltages. In other hand, the short channel effect also can be suppressed.

The second signal line 180 is overlapped with the gate 120. Therefore, the barrier height of the Schottky source may be well controlled by gate voltage (voltage applied on the gate 120). In some embodiments, the second signal line 180 is partially overlapped with the gate 120. In some embodiments, one of the first signal line 170 and the second signal line 180 is connected with a bit line, and the other one of the first signal line 170 and the second signal line 180 is connected with a common line. In other word, one of the first signal line 170 and the second signal line 180 is a drain electrode of the transistor 10, and the other one of the first signal line 170 and the second signal line 180 is a source electrode of the transistor 10.

Base on above, the transistor 10 with the Ohmic contact hole and the Schottky contact hole is formed, wherein the Ohmic contact hole and the Schottky contact hole are formed at the same time by a self-aligned process.

Figure 3:
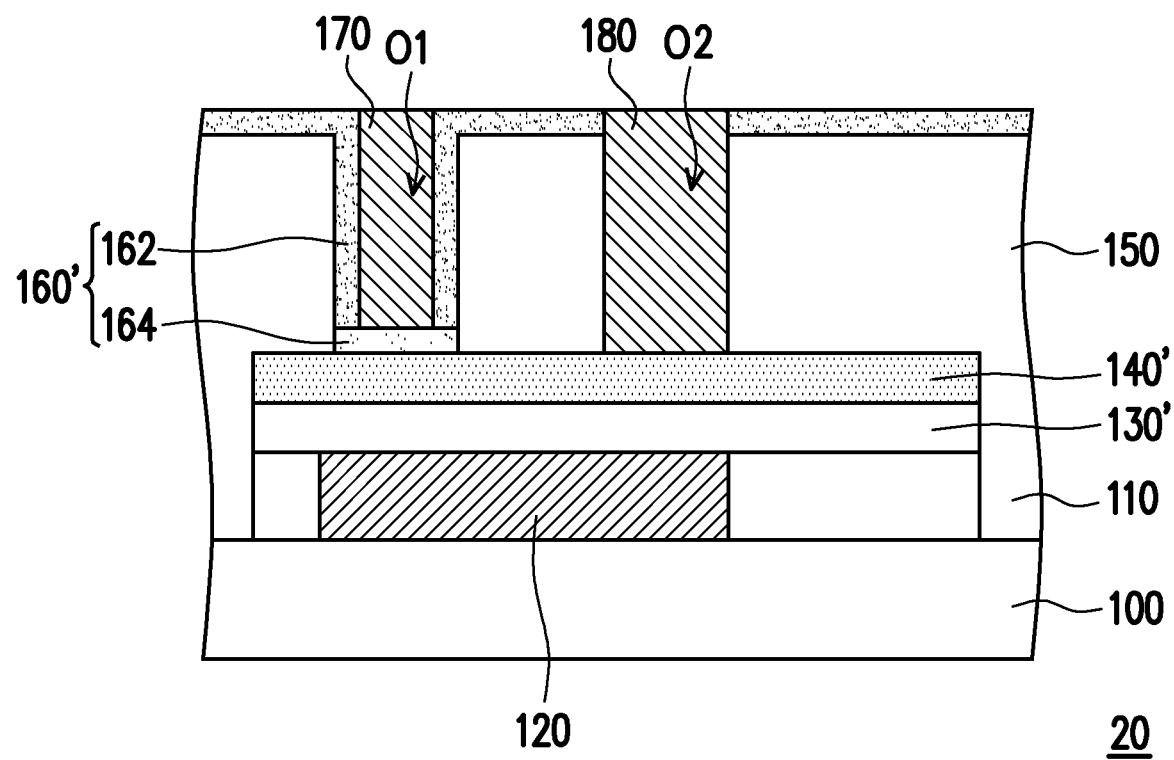
FIG. 3 schematically illustrates a cross-sectional view for a transistor in accordance with some embodiments of the disclosure.

FIG. 3 schematically illustrates cross-sectional view for a transistor in accordance with some embodiments of the disclosure. The transistor 20 of FIG. 3 is similar to the transistor 10 of FIG. 1I, hence the same reference numerals are used to refer to the same and liked parts, and its detailed description will be omitted herein. The main difference is described as follows.

Referring to FIG. 3, a transistor 20 includes a gate 120, a channel layer 140', a gate insulation layer 130', a passivation layer 150, a liner 160', a first signal line 170, and a second signal line 180. The channel layer 140' is overlapped with the gate 120. The gate insulation layer 130 is disposed between the gate 120 and the channel layer 140'. The passivation layer 150 is disposed over the gate insulation layer 130. The first signal line 170 is embedded in the passivation layer 150 to form a first via. The second signal line 180 is embedded in the passivation layer 150 to form a second via and directly connected with the channel layer 140'. The liner 160' includes an insulation region 162 and a conductive region 164 connected with the insulation region 162. The insulation region 162 is disposed over the passivation layer 150 and on sidewalls of the first via. The conductive region 164 is disposed under a bottom of the first via and connected with the channel layer 140'.

In the transistor 20, the first signal line 170 and the conductive region 164 are not overlapped with the gate 120, and the second signal line 180 is overlapped with the gate 120. Therefore, the effective channel length of the transistor 20 may be increased.

Base on above, the transistor 20 with the Ohmic contact hole and the Schottky contact hole is formed, wherein the Ohmic contact hole and the Schottky contact hole are formed at the same time by a self-aligned process.

FIGS. 4A through 4G schematically illustrate cross-sectional views for a fabrication method of a transistor in accordance with some embodiments of the disclosure. FIG. 5 schematically illustrates a top view of transistor in FIG. 4G. FIGS. 4A through 4F are corresponding to line AA in FIG. 5.

Figure 4A:
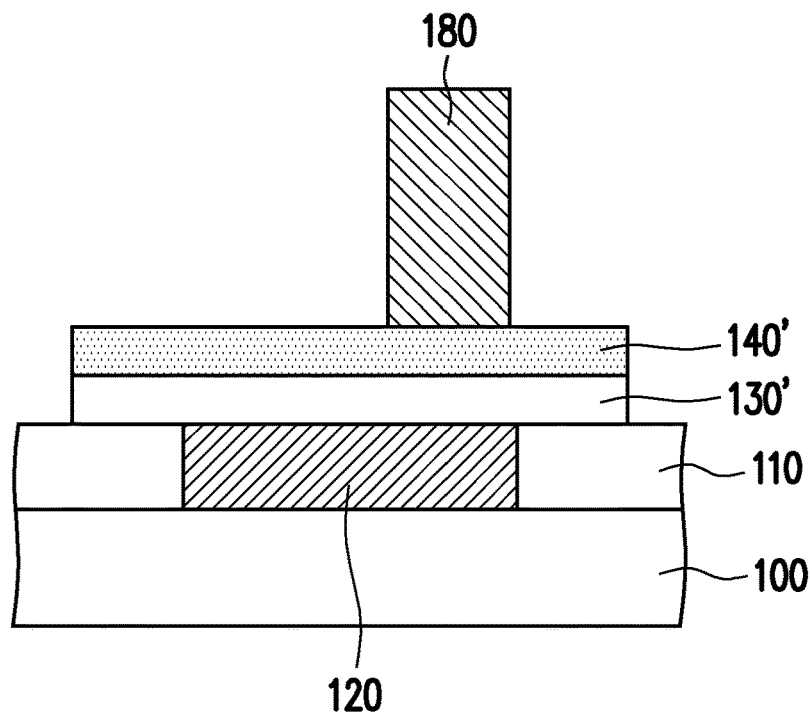
FIGS. 4A through 4G schematically illustrate cross-sectional views for a fabrication method of a transistor in accordance with some embodiments of the disclosure.
Figure 5:
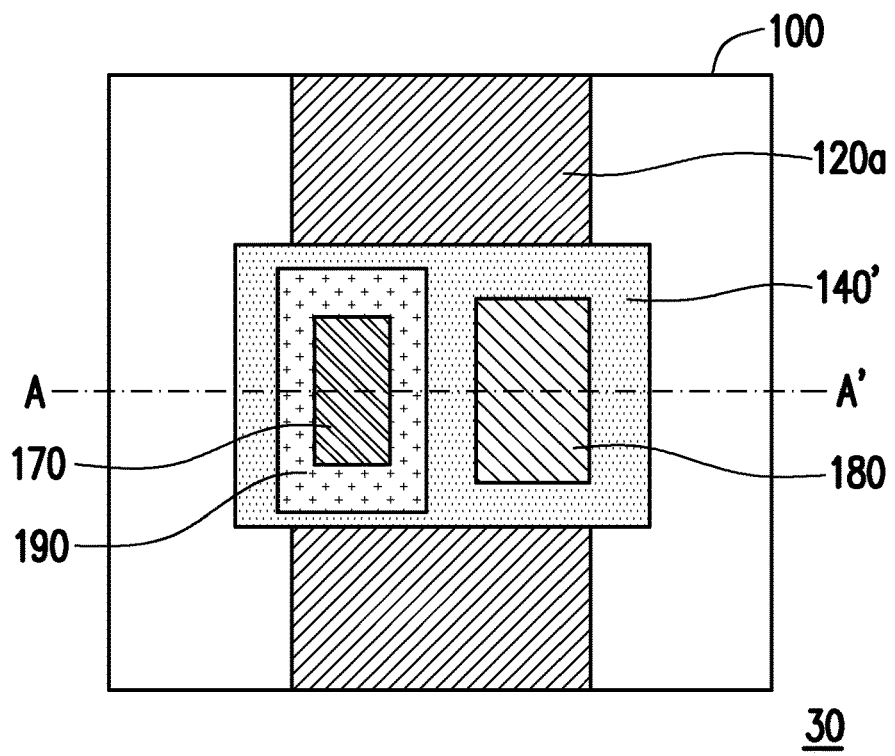
FIG. 5 schematically illustrates a top view of transistor in FIG. 4G.

After the structures of FIG. 1D are formed, a second signal line 180 is formed on the channel layer 140', as shown in FIG. 4A. The second signal line 180 is directly connected with the channel layer 140'. Schottky contact is between the second signal line 180 and the channel layer 140'. In some embodiments, the second signal line 180 is a high work function metal, such as Ni, Pt, Au, Ru, Pd, Au, Ir, Rh, W or a combination thereof.

The second signal line 180 is overlapped with the gate 120. Therefore, the barrier height of the Schottky source may be well controlled by gate voltage (voltage applied on the gate 120). In some embodiments, the second signal line 180 is completely overlapped with the gate 120 in a direction perpendicular to the top surface of the gate 120. In some embodiments, the second signal line 180 is partially overlapped with the gate 120. In some embodiments, the second signal line 180 is a conductive pillar or other conductive structure.

Figure 4B:
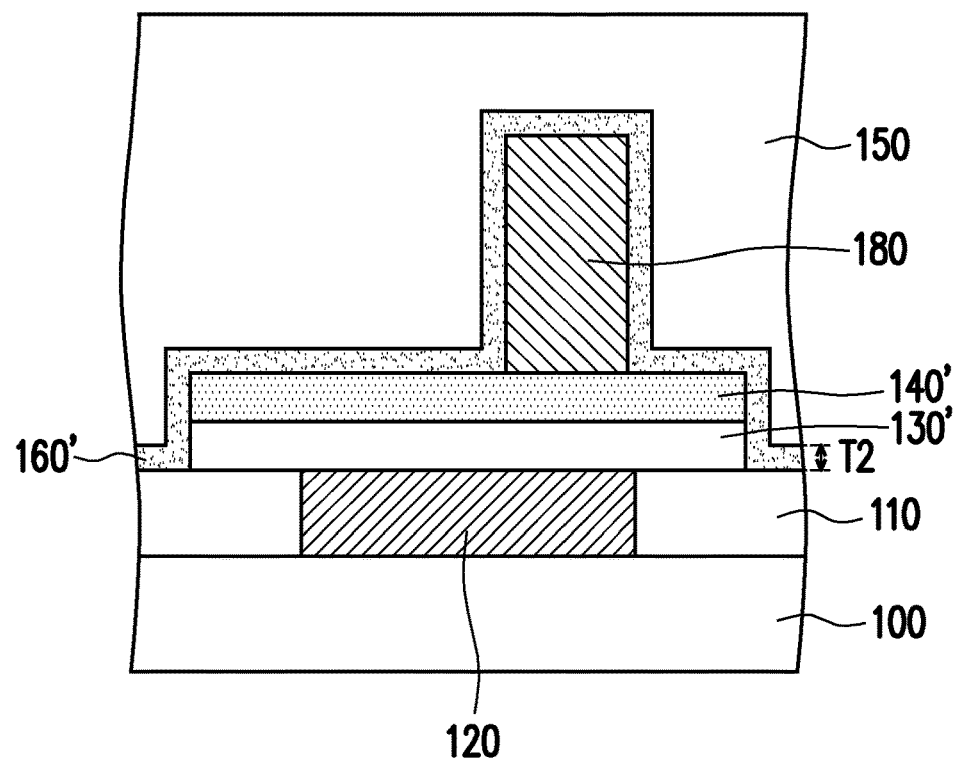

Referring to FIG. 4B, a liner 160' is formed on the second signal line 180 and the channel layer 140'. The second signal line 180, the channel layer 140', the gate insulation layer 130', and the dielectric layer 110 are covered by the liner 160'. In some embodiments, the liner 160' includes $Al_2O_3$. The thickness T2 of the liner 160' is in a range from about 5 nm to about 100 nm. The liner 160' is formed by CVD, ALD, chemical-solution deposition (CSD) and/or physical vapor deposition (PVD). In some embodiment, the liner 160' is an insulator layer which will not react with the channel layer 140'.

A first passivation layer 150 is formed over the gate insulation layer 130. In this embodiment, the first passivation layer 150 is formed on the liner 160.

In some embodiments, the liner 160' may be used as a hydrogen blocking layer. That is, the liner 160' prevents hydrogen in the first passivation layer 150 from incorporating into the channel layer 140'.

Figure 4C:
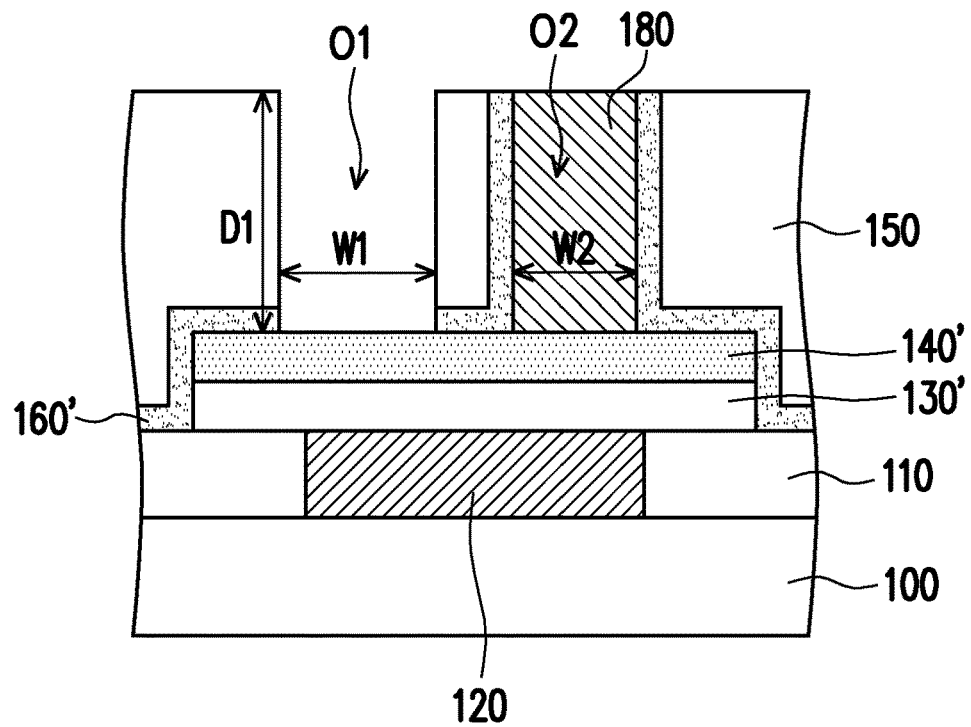

Referring to FIG. 4C, a planarization operation, such as chemical mechanical polishing (CMP) or an etch-back process, is performed so as to remove an upper part of the first passivation layer 150 and the liner 160', thereby a top surface of the second signal line 180 is exposed. In some embodiments, an upper part of second signal line 180 is also removed in the planarization operation.

A first opening O1 penetrating through the first passivation layer 150 and the liner 160' is formed by processes including a photolithography process and an etching process. The first opening O1 is overlapped with the channel layer 140'. The depth D1 of the first opening O1 is in a range from about 5 nm to about 500 nm. The width W1 of the first opening O1 is in a range from about 40 nm to about 200 nm. In this embodiment, the first opening O1 is partially overlapped with the gate 120. The second signal line 180 is disposed in a second opening O2 of the first passivation layer 150. In this embodiment, the width W1 of the first opening O1 is larger the width W2 of the second opening O2.

Figure 4D:
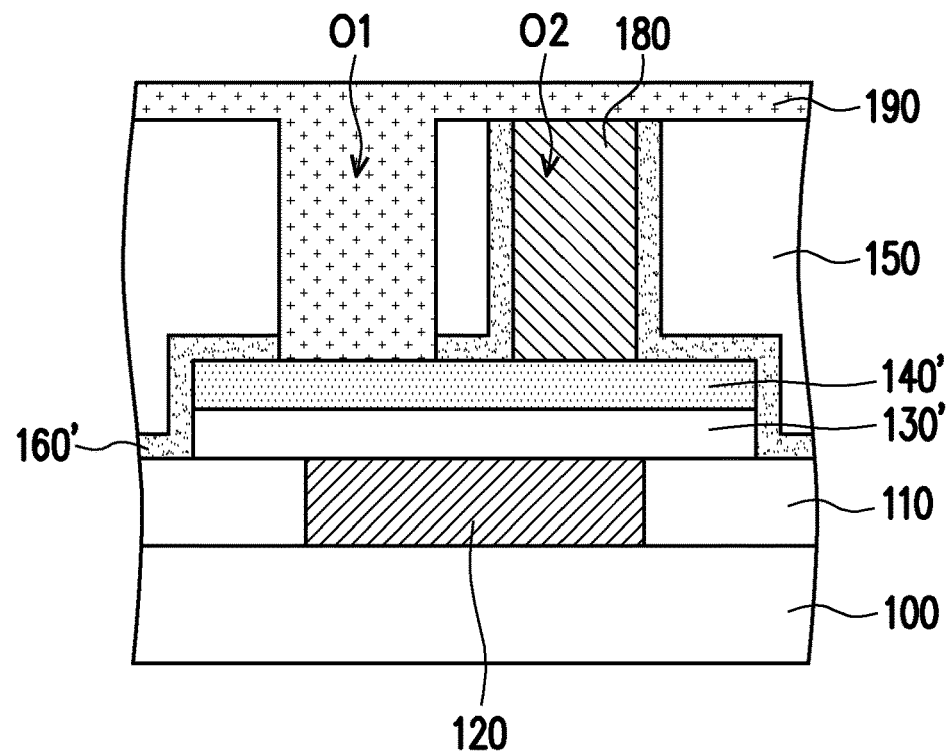

Referring to FIG. 4D, a second passivation layer 190 containing hydrogen is formed in the first opening O1. The second passivation layer 190 is directly connected with the channel layer 140'. The second passivation layer 190 is silicon based insulating material, such as silicon oxide, silicon nitride, SiOC, SiCN, SiOCN or SiON formed by CVD, PECVD or other suitable process. In some embodiments, the second passivation layer 190 and the first passivation layer 150 are made of a same material. Since the second passivation layer 190 (and the first passivation layer 150) is (are) deposited in the environment containing hydrogen, the second passivation layer 190 (and the first passivation layer 150) contain(s) the hydrogen after deposition process.

In some embodiment, a material of the second passivation layer 190 is different from a material of the first passivation layer 150. For example, a material of the second passivation layer 190 is silicon nitride, and a material of the first passivation layer 150 is silicon oxide.

Figure 4E:
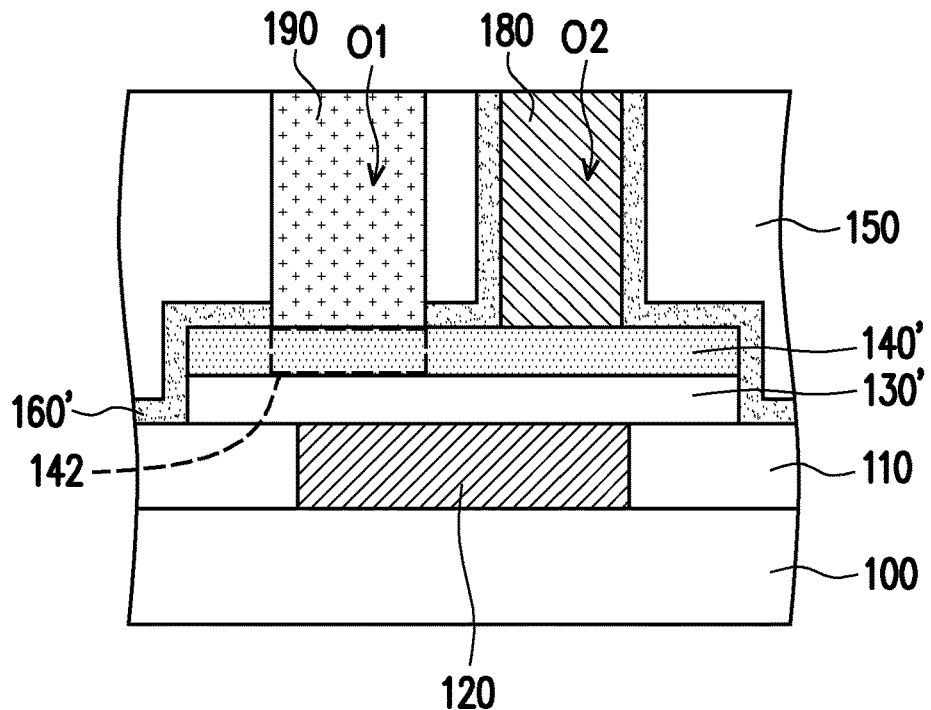

Referring to FIG. 4E, a planarization operation, such as chemical mechanical polishing (CMP) or an etch-back process, is performed so as to remove a part of the second passivation layer 190 outside the first opening O1. Then, the top surface of the second signal line 180 is exposed.

An n-type doped region 142 is formed at the junction between the channel layer 140' and the second passivation layer 190. In some embodiments, hydrogen in the second passivation layer 190 may react with the channel layer 140', such as indium gallium zinc oxide, so as to form the n-type doped region 142. For example, hydrogen is incorporated into indium gallium zinc oxide during the deposition process of the second passivation layer 190. Thus, a portion (the n-type doped region 142) of indium gallium zinc oxide (the channel layer 140') has the characteristics of an n-type semiconductor. The doping concentration of hydrogen in the n-type doped region 142 is in a range from $1e18$ $cm^{-3}$ to $5e20$ $cm^{-3}$.

In some embodiments, the second passivation layer 190 is deposited at 75° C. to 400° C., and the n-type doped region 142 is formed when depositing the second passivation layer 190. That is, the n-type doped region 142 may be formed without additional thermal treatment. In some embodiments, an additional thermal treatment is performed to increase the reaction rate of hydrogen incorporating into the channel layer 140'.

Figure 4F:
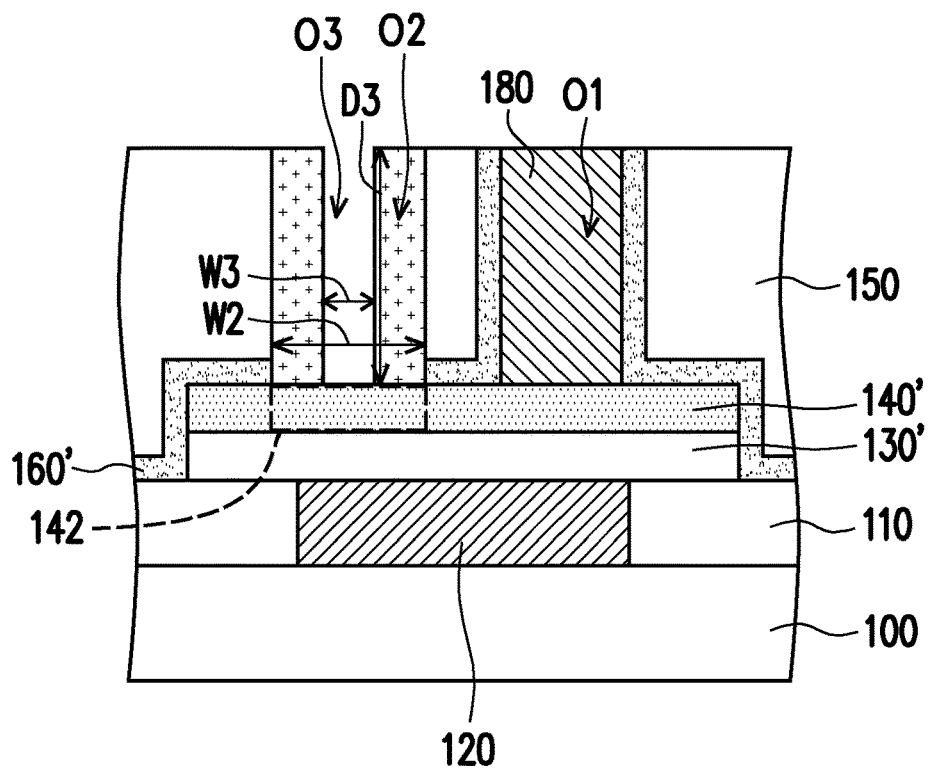

As shown in FIG. 4F, a third opening O3 is formed in the second passivation layer 190. In some embodiments, processes of forming the third opening O3 including a photolithography process and an etching process. The third opening O3 is penetrating through the second passivation layer 190. Therefore, a part of the surface of the channel layer 140' is exposed by the third opening O3. The n-type doped region 142 is disposed under the third opening O3. The depth D3 of the third opening O3 is in a range from about 5 nm to about 500 nm. The width W3 of the third opening O3 is in a range from about 20 nm to about 200 nm. In some embodiments, the width W3 of third opening O3 is smaller than the width W2 of the second opening O2. In some embodiment, the second passivation layer 190 may be entirely removed.

Figure 4G:
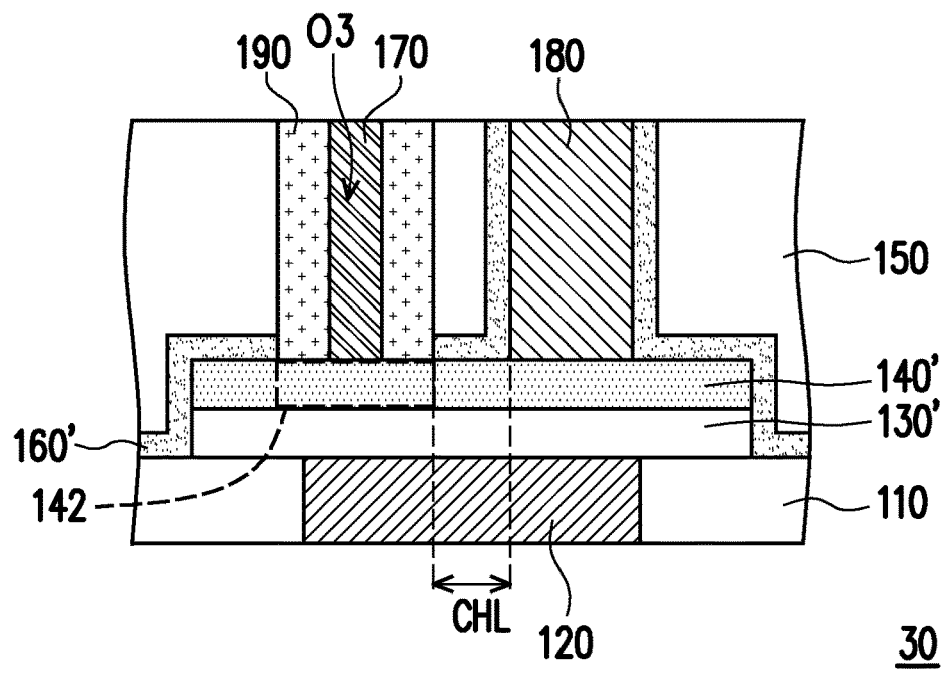

As shown in FIG. 4G and FIG. 5, a first signal line 170 is formed. The first signal line 170 is directly connected with the n-type doped region 142 under the third opening O3. Ohmic contact is between the first signal line 170 and the channel layer 140'. In this embodiment, the first signal line 170 is overlapped with the gate 120. However, the disclosure is not limited thereto. In other embodiments, the first signal line 170 is not overlapped with the gate 120. In some embodiments, one of the first signal line 170 and the second signal line 180 is connected with a bit line, and the other one of the first signal line 170 and the second signal line 180 is connected with a common line.

In some embodiments, a metal material is deposited in the third opening O3, on the top surface of second signal line 180, on the top surface of the first passivation layer 150, and on the top surface of the second passivation layer 190. Then, a planarization operation, such as chemical mechanical polishing (CMP) or an etch-back process, is performed so as to remove an upper part of the metal material, thereby forming the first signal line 170 separated from the second signal line 180. In some embodiments, the first signal line 170 and the second signal line 180 are made of the same material. The first signal line 170 and the second signal line

180 are high work function metals, such as Ni, Pt, Au, Ru, Pd, Au, Ir, Rh, W or a combination thereof.

In some embodiments, the first signal line 170 has a material that is different from a material of the second signal line 180. For example, the material of the first signal line 170 is low work function metals, such as Al, Ag, Ti, Ta, TaN, Nb, Mn or a combination thereof. In some embodiments, a work function of the first signal line 170 is lower than or equal to a work function of the second signal line 180.

A part of the second passivation layer 190 is disposed between the second signal line 180 and the first passivation layer 150. In this embodiment, the effective channel length CHL is about equal to the distance between the second signal line 180 and the second passivation layer 190 which is longer than the distance between the second signal line 180 and the first signal line 170. That is, the effective channel length CHL of the transistor 30 is improved by the fabrication method of this embodiment.

Base on above, A transistor 30 with the Ohmic contact hole and the Schottky contact hole is formed.

Figure 6:
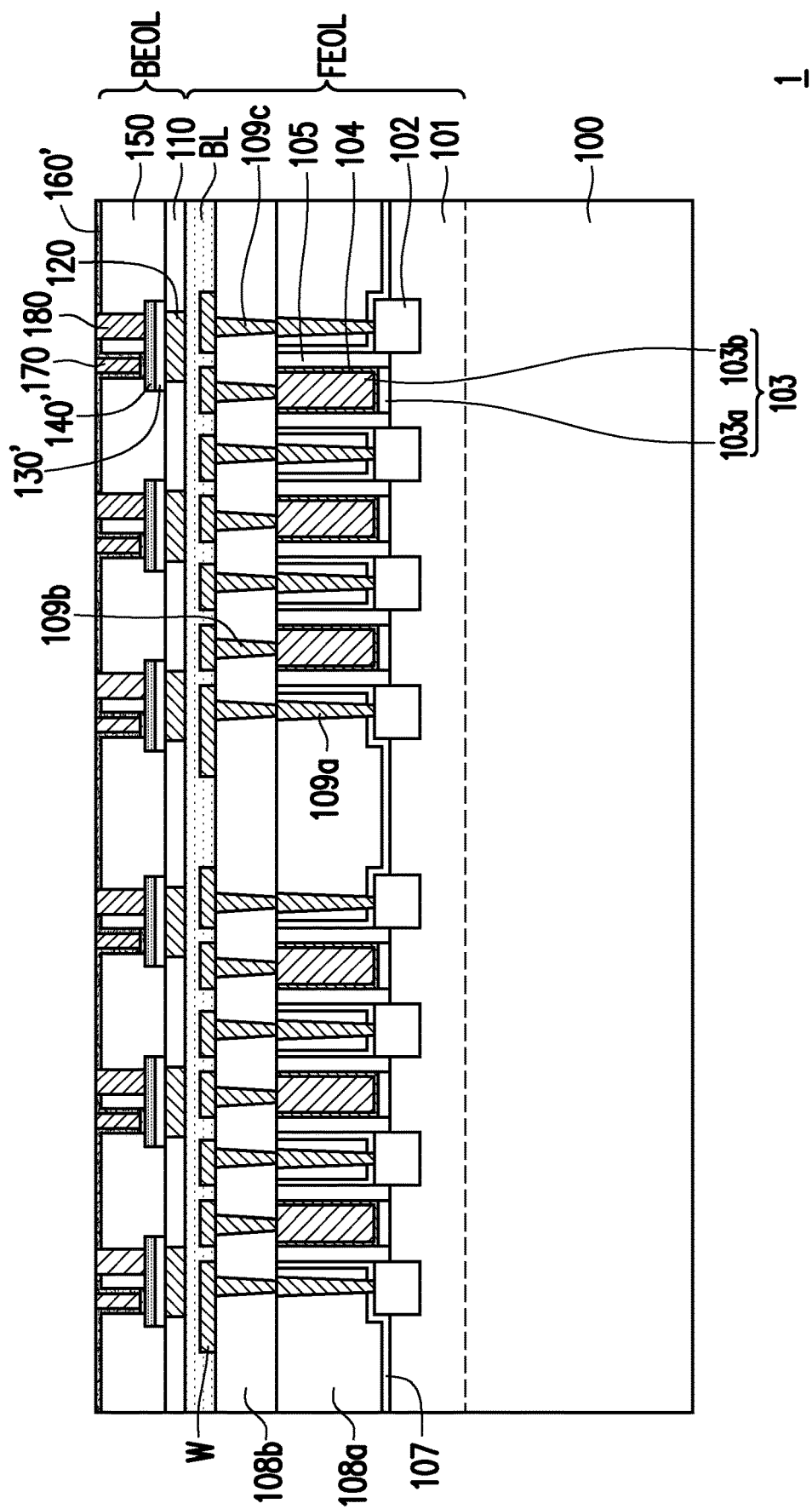
FIG. 6 schematically illustrate a cross-sectional view of a semiconductor device in accordance with some embodiments of the disclosure.

FIG. 6 schematically illustrate a cross-sectional view of a semiconductor device in accordance with some embodiments of the disclosure.

As shown in FIG. 6, the semiconductor device 1 includes front end of line (FEOL) devices formed on the substrate 100 and back end of line (BEOL) devices formed on the FEOL devices. In some embodiment, the FEOL devices include MOS-FETs, Fin-FETs, NCFETs or other applicable transistors. The BEOL devices include transistors of any of the foregoing embodiments.

Referring to FIG. 6, multiple fin structures 101 are formed on the substrate 100. Epitaxial structures 102 are respectively formed over the fin structures 101, in accordance with some embodiments. The epitaxial structures 102 may function as source/drain features. Gate stacks 103 are disposed over the fin structures 101. Each of the gate stacks 103 includes a dielectric layer 103*a* and a gate electrode 103*b*. Ferroelectric layers 104 are disposed between the dielectric layers 103*a* and the gate electrodes 103*b*. Spacer elements 105 are disposed by the sidewall portions of the ferroelectric layers 104 and the gate stacks 103. An etch stop layer 107 is disposed on the epitaxial structures 102 and the spacer elements 105. A dielectric layer 108*a* is disposed on the etch stop layer 107. The contacts 109*a* are formed to penetrated through the dielectric layer 108*a* and the etch stop layer 107, and the contacts 109*a* may serve as bottom portions of source/drain contacts which are electrically connected to the epitaxial structures 102 (i.e. the source/drain features 102).

The dielectric layer 108*b* may be deposited over the dielectric layer 108*a*. The contacts 109*b* and 109*c* are formed to penetrated through the dielectric layer 108*b*, the contact 109*b* may serve as gate contacts which are electrically connected to the gate electrode 103*b*, and the contacts 109*c* land on the contacts 109*a* and may serve as upper portions of source/drain contacts.

The conductive wirings W may be formed on the dielectric layer 108*b* to electrically connected to the contacts 109*b* and 109*c*. A buffer layer BL is formed over the dielectric layer 108*b* to cover the conductive wirings W. In some embodiments, the buffer layer BL may serve as a diffusion barrier layer for preventing contamination resulted from manufacturing processes of back end of line.

After forming the buffer layer BL, the BEOL devices including transistors are formed on the buffer layer BL. The fabrication method of the transistors of the BEOL devices can be referred to any of the foregoing embodiments.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with one aspect of the present disclosure, a transistor includes a gate electrically connected with a word line, a channel layer, a gate insulation layer, a passivation layer, a liner, a first signal line, and a second signal line. The channel layer is overlapping the gate. The gate insulation layer is disposed between the gate and the channel layer. The passivation layer is disposed over the gate insulation layer. The first signal line is embedded in the passivation layer to form a first via in the passivation layer and overlapping the channel layer. The second signal line is embedded in the passivation layer to form a second via in the passivation layer and overlapping the channel layer. The second signal line is in contact with the channel layer. The liner includes an insulation region and a conductive region connected with the insulation region. The insulation region is disposed over the passivation layer and on sidewalls of the first via. The conductive region is disposed under a bottom of the first via and connected with the channel layer. The first signal line is electrically connected with the channel layer through the conductive region.

In accordance with another aspect of the present disclosure, a fabrication method of a transistor, comprising: forming a gate and a word line electrically connected with the gate over a substrate; forming a gate insulation layer over the gate; forming a channel layer over the gate insulation layer; forming a passivation layer over the gate insulation layer, wherein the passivation layer has a first via overlapping the channel layer; forming a metal layer on the passivation layer and in the first opening; forming a second opening penetrating through the passivation layer and the metal layer, wherein the second opening is overlapping the channel layer; heating the metal layer to form a liner comprising an insulation region and a conductive region, wherein the insulation region is disposed over the passivation layer and sidewalls of the first opening, and the conductive region is disposed in a bottom of the first opening and connected with the channel layer; forming a first signal line in the first opening; and forming a second signal line in the second opening.

In accordance with another aspect of the present disclosure, a fabrication method of a transistor, comprising: forming a gate and a word line electrically connected with the gate over a substrate; forming a gate insulation layer over the gate; forming a channel layer over the gate insulation layer; forming a second signal line in contact with the channel layer; forming a first passivation layer over the gate insulation layer, wherein the second signal line is disposed in a second opening of the first passivation layer; forming a first opening penetrating through the first passivation layer and overlapping the channel layer; forming a second passivation layer containing hydrogen in the first opening, wherein the second passivation layer is in contact with the channel layer; forming an n-type doped region at the junction between the channel layer and the second passivation layer; forming a third opening penetrating through the second passivation layer; and forming a first signal line in contact with the n-type doped region under the third opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fabrication method of a transistor, comprising:
forming a gate and a word line electrically connected with the gate over a substrate;
forming a gate insulation layer over the gate;
forming a channel layer over the gate insulation layer;
forming a passivation layer over the gate insulation layer, wherein the passivation layer has a first opening overlapped with the channel layer;
forming a metal layer on the passivation layer and in the first opening;
forming a second opening penetrating through the passivation layer and the metal layer, wherein the second opening is overlapping the channel layer;
heating the metal layer to form a liner comprising:
an insulation region, disposed over the passivation layer and sidewalls of the first opening; and
a conductive region, disposed in a bottom of the first opening and connected with the channel layer;
forming a first signal line in the first opening; and
forming a second signal line in the second opening.

2. The fabrication method according to claim 1, wherein the metal layer includes Al.

3. The fabrication method according to claim 1, wherein the insulation region includes $Al_2O_3$, and the conductive region includes $AlO_x$, $InO_y$, and $ZnO_z$, wherein x is not 3/2, and x, y, and z are greater than 0.

4. The fabrication method according to claim 1, wherein the channel layer includes indium gallium zinc oxide.

5. A fabrication method of a transistor, comprising:
forming a gate and a word line electrically connected with the gate over a substrate;
forming a gate insulation layer over the gate;
forming a channel layer over the gate insulation layer;
forming a second signal line in contact with the channel layer;
forming a first passivation layer over the gate insulation layer, wherein the second signal line is disposed in a second opening of the first passivation layer;
forming a first opening penetrating through the first passivation layer and overlapped with the channel layer;
forming a second passivation layer containing hydrogen in the first opening, wherein the second passivation layer is in contact with the channel layer;
forming an n-type doped region at the junction between the channel layer and the second passivation layer;
forming a third opening penetrating through the second passivation layer; and
forming a first signal line in contact with the n-type doped region under the third opening.

6. The fabrication method according to claim 5, further comprises
forming a liner on the second signal line and the channel layer; and
forming the first opening penetrating through the first passivation layer and the liner.

7. The fabrication method according to claim 6, wherein the liner includes $Al_2O_3$.

8. The fabrication method according to claim 5, wherein the channel layer includes indium gallium zinc oxide.

9. The fabrication method according to claim 5, wherein a material of the first signal line is different from a material of the second signal line.

10. The fabrication method according to claim 9, wherein a work function of the first signal line is lower than a work function of the second signal line.

11. The fabrication method according to claim 5, wherein a distance between the first signal line and the second signal line is longer than a distance between the second passivation layer and the second signal line.

12. The fabrication method according to claim 5, further comprises
forming a dielectric layer over a substrate, wherein the gate is embedded in the dielectric layer; and
forming the gate insulation layer over the dielectric layer and the gate.

13. The fabrication method according to claim 5, wherein Schottky contact is between the first signal line and the channel layer, and Ohmic contact is between the second signal line and the channel layer.

* * * * *